(12) United States Patent
Ryu et al.

(10) Patent No.: US 8,222,068 B2
(45) Date of Patent: Jul. 17, 2012

(54) METHOD FOR MANUFACTURING IMAGE SENSOR

(75) Inventors: Sang-Wook Ryu, Cheongju-si (KR); Byoung-Saek Tak, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 979 days.

(21) Appl. No.: 12/113,965

(22) Filed: May 2, 2008

(65) Prior Publication Data
US 2008/0293181 A1 Nov. 27, 2008

(30) Foreign Application Priority Data

May 17, 2007 (KR) .................. 10-2007-0047887

(51) Int. Cl.
*H01L 21/00* (2006.01)
(52) U.S. Cl. .............. 438/70; 438/82; 438/99; 438/221; 438/623; 438/725
(58) Field of Classification Search ............ 438/70, 438/82, 99, 199, 221, 562, 623, 725, 780, 438/FOR. 135
See application file for complete search history.

(56) References Cited

U.S. PATENT DOCUMENTS

| 6,369,417 | B1 | 4/2002 | Lee | |
|---|---|---|---|---|
| 6,479,398 | B1 | 11/2002 | Chen | |
| 7,524,770 | B2* | 4/2009 | Park | 438/713 |
| 7,560,744 | B2* | 7/2009 | Hsiao et al. | 257/98 |
| 2005/0101043 | A1 | 5/2005 | Chen et al. | |
| 2006/0163686 | A1* | 7/2006 | Liu et al. | 257/501 |
| 2007/0235771 | A1* | 10/2007 | Liu | 257/223 |
| 2008/0048280 | A1* | 2/2008 | Tsukamoto | 257/432 |
| 2008/0116537 | A1* | 5/2008 | Adkisson et al. | 257/448 |
| 2008/0179640 | A1* | 7/2008 | Chuang et al. | 257/292 |

FOREIGN PATENT DOCUMENTS

| JP | 2006-351761 | 12/2006 |
|---|---|---|
| JP | 2008-185693 | 8/2008 |
| KR | 10-2007-0023027 | 2/2007 |

* cited by examiner

*Primary Examiner* — N Drew Richards
*Assistant Examiner* — Joannie A Garcia
(74) *Attorney, Agent, or Firm* — Sherr & Vaughn, PLLC

(57) ABSTRACT

A method for manufacturing an image sensor including forming a microlens array over a color filter array, forming a capping layer over the semiconductor substrate including the microlens array, forming a pad mask over the capping layer, and then exposing a pad in an interlayer dielectric layer.

18 Claims, 3 Drawing Sheets

METHOD FOR MANUFACTURING IMAGE SENSOR

Figure 1:
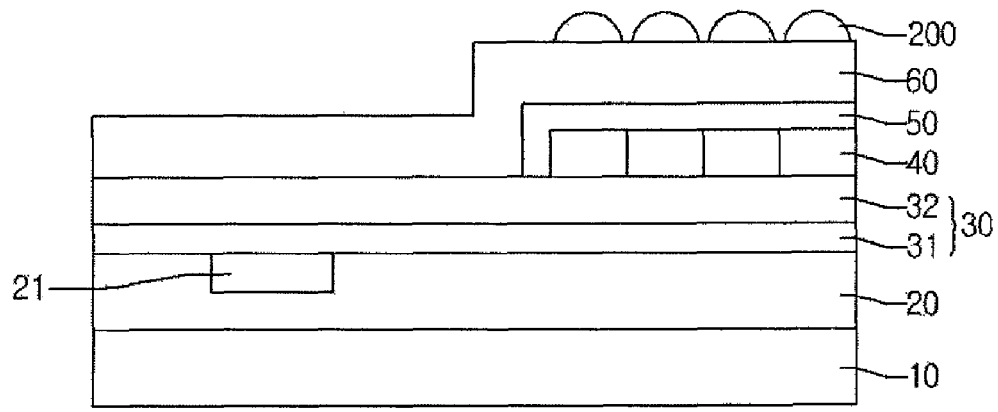

The present application claims priority under 35 U.S.C. 119 and 35 U.S.C. 365 to Korean Patent Application No. 10-2007-0047887 (filed on May 17, 2007), which is hereby incorporated by reference in its entirety.

BACKGROUND

An image sensor is a semiconductor device for converting an optical image into an electrical signal. An image sensor may be classified as a charge coupled device (CCD) image sensor or a complementary metal oxide semiconductor (CMOS) image sensor (CIS).

The CIS may include a plurality of photodiodes and MOS transistors within a unit pixel for sequentially detecting electrical signals of respective unit pixels in a switching manner to realize an image.

The CIS may further include forming a microlens on and/or over a color filter to enhance light sensitivity of the CIS. The microlens may be formed in a semicircular/hemispherical shape by sequentially performing an exposure process, a development process, and a reflow process on a photosensitive organic material.

However, since the photosensitive organic material has weak physical properties and thus, the microlens may be easily damaged by physical impacts that may result in cracking, etc. in subsequent processes such as packaging and bumping, etc. Since the photosensitive organic material has relatively strong viscosity, a defect on the microlens may develop when particles are absorbed. In order to prevent this occurrence, use of a passivation layer composed of an oxide layer or a nitride layer having high hardness may be used or composing the microlens of inorganic material. Moreover, since the upper portion of the CIS is formed of a photosensitive organic material vulnerable to heat of 250° C. or more, an interface trap by a plasma process may occur. Accordingly, such damaging effects to the microlens may result in the generation of a dark current.

SUMMARY

Embodiments relate to a method for manufacturing an image sensor that can prevent generation of a dark current.

Embodiments relate to a method for manufacturing an image sensor that can include at least one of the following steps: forming an interlayer dielectric layer including a pad over a semiconductor substrate; forming a color filter array directly over the interlayer dielectric layer; forming a microlens array over the color filter array; forming a capping layer over the semiconductor substrate including the microlens array; forming a pad mask over the capping layer; and then exposing the pad.

Embodiments relate to a method for manufacturing an image sensor that can include at least one of the following steps: forming an interlayer dielectric layer including a pad over a semiconductor substrate; forming a passivation layer over the interlayer dielectric layer; forming a color filter array over the passivation layer; forming a planarization layer over the color filter array; forming a microlens array over the planarization layer including a first dielectric layer over the planarization layer and a second dielectric layer formed over the first dielectric layer; forming an organic layer over the semiconductor substrate including the microlens array; forming a pad mask over the organic layer, the pad mask including a first pad hole exposing an upper surface portion of the organic layer which spatially corresponds to the pad; exposing an uppermost surface of the pad by etching the organic layer, the second dielectric layer, the first dielectric layer, and the passivation layer using the pad mask as an etch mask; and then simultaneously removing the organic layer and the pad mask.

Embodiments relate to a method for manufacturing an image sensor that can include at least one of the following steps: forming an interlayer dielectric layer including a pad over a semiconductor substrate; forming a passivation layer over the interlayer dielectric layer; forming a color filter array over the passivation layer; forming a planarization layer over the color filter array; forming a microlens array over the planarization layer including a plurality of contacting microlenses having a zero gap therebetween, the microlens array further including a first dielectric layer over the planarization layer and a second dielectric layer formed over the first dielectric layer; forming a metal layer over the semiconductor substrate including the microlens array; forming a pad mask over the metal layer, the pad mask including a first pad hole exposing an upper surface portion of the metal layer which spatially corresponds to the pad; exposing an uppermost surface of the pad by etching the metal layer, the second dielectric layer, the first dielectric layer, and the passivation layer using the pad mask as an etch mask; removing the pad mask; and then removing the metal layer.

DRAWINGS

Example FIGS. 1 to 6 illustrate a method of manufacturing an image sensor, in accordance with embodiments.

DESCRIPTION

As illustrated in example FIG. 1, interlayer dielectric layer 20 can be formed on and/or over semiconductor substrate 10. A light detecting portion including a photodiode and a circuit region can also be formed for each unit pixel on and/or over semiconductor substrate 10. The light detecting portion including the photodiode can include a device isolation layer defining an active region and a field region formed on and/or over semiconductor substrate 10. Each unit pixel can include a photodiode for receiving light to generate a photo charge, and a CMOS circuit electrically connected to the photodiode for converting the generated photo charge into an electrical signal.

After related devices including the device isolation layer and the photodiode are formed, interlayer dielectric layer 20 can be formed on and/or over semiconductor substrate 10. A plurality of metal lines electrically connected to the light detecting portion can be formed in interlayer dielectric layer 20. Interlayer dielectric 20 including the metal lines can be formed having a multilayer structure composed of a plurality of layers. Each metal line can be formed so as not to shade or otherwise screen light incident on the photodiode.

Pad 21 can be formed in interlayer dielectric layer 20 while a final metal line of the metal lines is formed. Passivation layer 30 can be formed on and/or over interlayer dielectric layer 20 including pad 21 and serve to protect a device from undesirable moisture or scratching. For example, passivation layer 30 can be formed having a stacked, multilayer, dielectric structure including at least one of a silicon oxide layer, a silicon nitride layer, and a silicon oxide nitride layer. As illustrated in example FIG. 1, passivation layer 30 can have a structure including a first lower layer composed of tetraethyl-ortho-silicate (TEOS) layer 31 having a thickness of between 1,000-5,000 Å, and second upper layer composed of nitride layer 32 having a thickness of between 1,000-10,000 Å.

Color filter 40 including a plurality of filters can then be formed through a subsequent process on and/or over passivation layer 30. Color filter 40 can also be formed directly on and/or over interlayer dielectric layer 20 including pad 21 to obtain an image sensor having a reduced thickness and overall size.

A first pad exposure process for exposing pad 21 can then be performed. In the first pad exposure process, photoresist patterns having a hole corresponding to a pad region can be formed on and/or over passivation layer 30. Also, passivation layer 30 can be etched using the photoresist patterns as an etch mask to expose the uppermost surface of pad 21. Therefore, after the first pad exposure process is performed, a microlens array can then be formed, and then a second pad exposure process can be performed. The first pad exposure process can be omitted.

Color filter 40 can then be formed on and/or over passivation layer 30 and can include a plurality of color filters for realizing a color image. Such color filters can represent a different color such as red, green, and blue. Examples of a material that can be used for color filter 40 include a dyed photoresist. Color filter 40 can be formed on and/or over each unit pixel to separate color from incident light such that adjacent color filters 40 can slightly overlap each other to have a height difference. To complement this height difference, planarization layer 50 can be formed on and/or over color filters 40. A microlens array to be formed in a subsequent process should be formed on and/or over a planarized surface. Therefore, planarization layer 50 can be formed on and/or over color filters 40 to remove the height difference caused by overlapping color filters 40. Of course, planarization layer 50 can be omitted.

First dielectric layer 60 for forming microlenses can then be formed directly on and/or over color filters 40 or planarization layer 50. Microlens array mask 200 for each unit pixel can then be formed on and/or over first dielectric layer 60. First dielectric layer 60 can be composed of at least one of an oxide layer, a nitride layer, and a nitride oxide layer. For example, first dielectric layer 60 can be composed of an oxide layer such as $SiO_2$ formed having a thickness of between about 2,000-20,000 Å at a temperature range of between about 50-250° C. using chemical vapor deposition (CVD), physical vapor deposition (PVD), or plasma enhanced CVD (PECVD).

Microlens array masks 200 can be formed including a plurality of microlens masks formed spaced apart a predetermined distance by coating first dielectric layer 60 with a photoresist layer and then performing a patterning process and a reflow process. Microlens mask 200 can then be formed having hemispherical shape.

Figure 2:
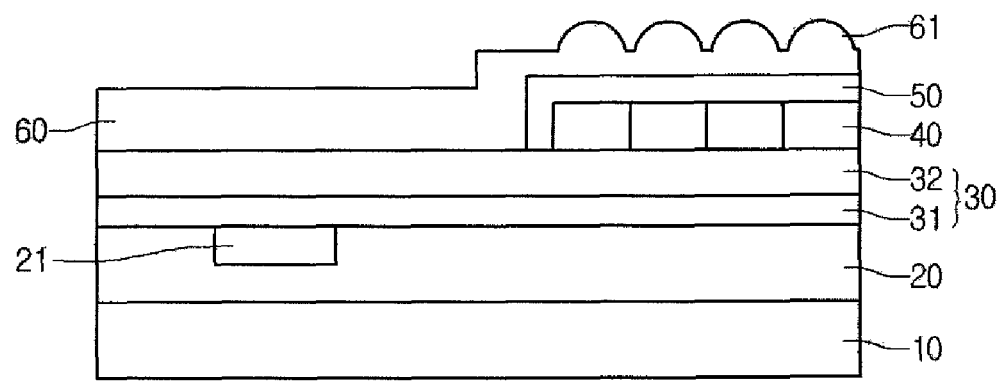

As illustrated in example FIG. 2, seed microlens 61 array for each unit pixel can then be formed on and/or over first dielectric layer 60. Seed microlens array 61 can be formed by performing an etching process on first dielectric layer 60 using microlens array masks 200 as an etch mask. The etching of first dielectric layer 60 can be performed such that a photoresist layer forming microlens array mask 200 and an oxide layer forming first dielectric layer 60 are etched at an etching ratio of between about 1:0.7-1.3. Therefore, the etching of first dielectric layer 60 for forming seed microlens array 61 can be performed until microlens array mask 200 composed of a photoresist material is completely etched. For example, the etching process for first dielectric layer 60 can be performed in a chamber by supplying an etching gas of $C_xH_yF_z$ (x,y,z are zeros or natural numbers), and an inert gas such as at least one of Ar, He, $O_2$, and $N_2$. Specifically, the etching process can be performed using a source power of between about 600-1400 W at 27 MHz, and a bias power of between about 0-500 W at 2 MHz applied in the chamber, and injecting an etching gas in the chamber including $CF_4$ of about 40-120 sccm and an inert gas such as at least one of $O_2$ of about 2-20 sccm and Ar of about 200-900 sccm.

First dielectric layer 60 can be etched to a thickness of between about 1,000-19,000 Å to form seed microlens array 61. Seed microlens array 61 can be formed having a thickness of between about 1,000-6,000 Å. Particularly, the process can be progressed such that the bias power is not applied to the chamber during the etching process. This can result in reducing the energy of ions moving from plasma generated inside the chamber to semiconductor substrate 10. In turn, the etching damage to first dielectric layer 60 can be reduced. A dark current by a trap level generated at the interface of semiconductor substrate 10 during a plasma process can also be prevented.

As illustrated in example FIG. 2, through the above-described etching process, seed microlens array 61 having a hemispherical shape can be formed of a lower temperature oxide layer on and/or over corresponding color filters 40. Seed microlens array 61 can be formed such that each respective seed microlens is separated from an adjacent seed microlens to prevent a merging phenomenon.

Figure 3:
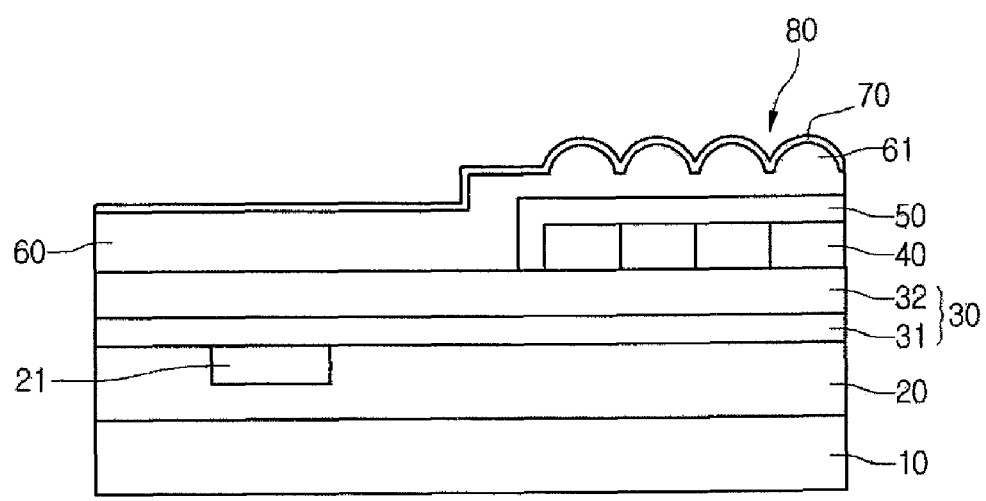

As illustrated in example FIG. 3, second dielectric layer 70 can then formed on and/or over semiconductor layer 10 including seed microlens array 61 to form microlens array 80. Second dielectric layer 70 can be deposited on and/or over the uppermost surface of first dielectric layer 60 including seed microlens array 61 and also in gaps between adjacent seed microlenses. Thus, each one of the seed microlenses can directly contact an adjacent seed microlens. Therefore, microlens array 80 including seed microlens array 61 and second dielectric layer 70 can be formed having a continuous hemispherical shape without gaps between adjacent microlenses. Second dielectric layer 70 can be composed of the same material as that of first dielectric layer 60. For example, second dielectric layer 70 can be formed by depositing an oxide layer to a thickness of between about 500-20,000 Å at a temperature range of between about 50-250° C.

Because second dielectric layer 70 is deposited having a thin thickness on and/or over seed microlenses 61 and in gaps therebetween, a microlens 80 can be formed such that adjacent microlenses can be in direct contact. Therefore, a gap between the microlenses can be reduced to zero, thereby enhancing the image quality of the image sensor.

Figure 4:
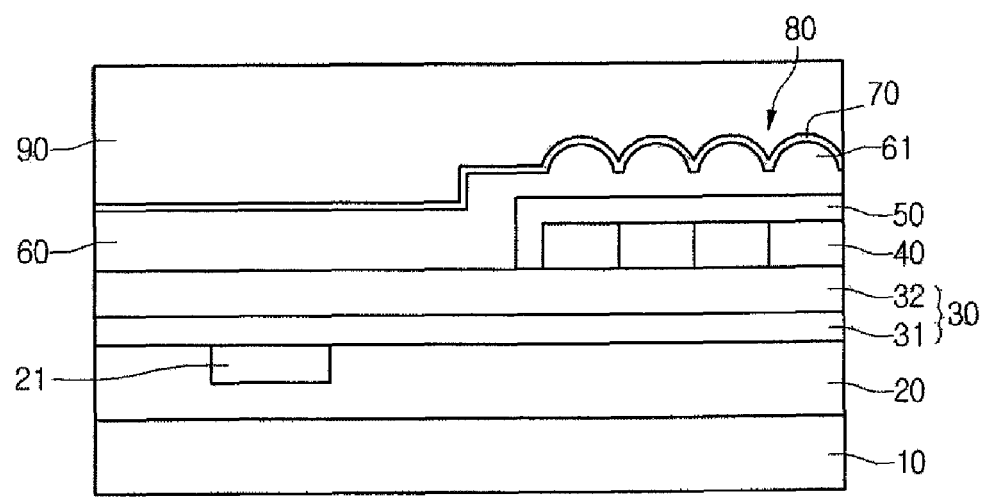

As illustrated in example FIG. 4, capping layer 90 can then be formed on and/or over semiconductor substrate 10 including microlens array 80 for preventing a trap level generated between semiconductor substrate 10 and the dielectric by an ultraviolet (UV) radiation generated during a plasma etching process.

Capping layer 90 can be deposited to have a thickness of between about 100-3,000 Å to cover both microlens array 80 and interlayer dielectric layer 20 formed on and/or over semiconductor substrate 10. Capping layer 90 can be composed of an organic bottom anti-reflection coating layer (BARC). When capping layer 90 is formed as an organic BARC layer, capping layer 90 can absorb UV radiation generated during the plasma etching process to prevent a trap level generated between semiconductor substrate 10 and the dielectric layer.

Alternatively, capping layer 90 can be composed of a metal layer formed by depositing a metal material having an electrical conductivity of about $10^{-6}$ ohm/m or more. Such metal materials that can be used for capping layer 90 include at least one of Al, Ti, W, and TiN, i.e., materials having electrical conductivity of about $10^{-6}$-$10^{-3}$ ohm/m. When capping layer 90 is formed as a metal layer, capping layer 90 can reflect UV radiation generated during the plasma etching process to prevent a trap level generated between semiconductor substrate 10 and the dielectric layer.

Figure 5:
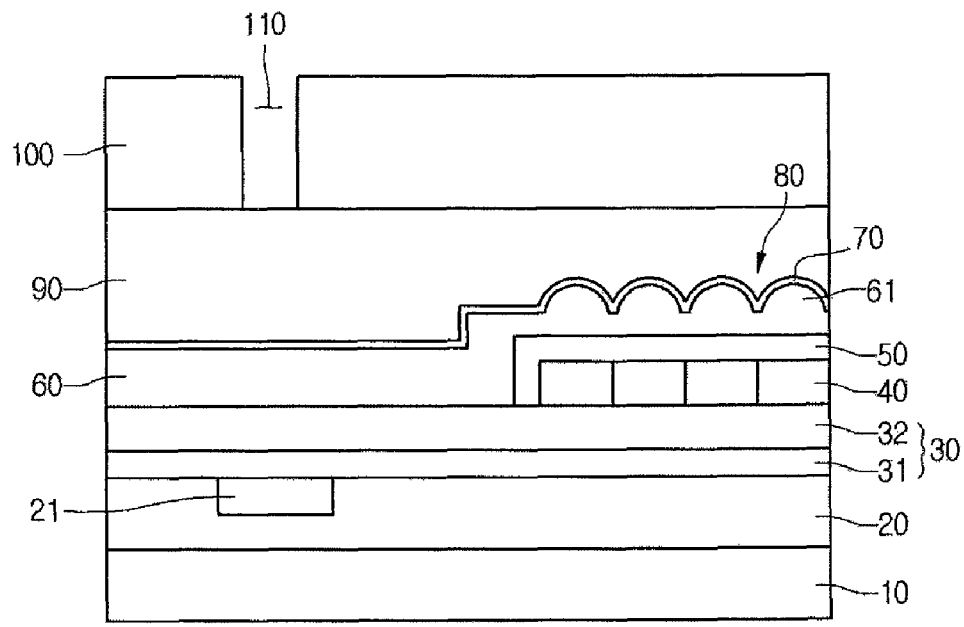

As illustrated in example FIG. 5, pad mask 100 including pad hole 110 can then be formed on and/or over capping layer 90. Pad mask 100 can be formed by coating capping layer 90 with a photoresist and patterning the photoresist. An upper surface portion of capping layer 90 spatially corresponding to pad 21 can be exposed by pad hole 110, and the rest of capping layer 90 can be covered by pad mask 100.

Portions of capping layer 90, second dielectric 70, first dielectric 60, and passivation layer 30 can then be etched using pad mask 100 as an etch mask to form pad exposure hole 23 exposing the uppermost surface of pad 21. Pad exposure hole 23 can be formed through a dry etching process. For example, pad exposure hole 23 can be formed through the same etching process used to form seed microlens array 61. Particularly, pad exposure hole 23 can be performed through an etching process using a source power of between about 600-1400 W at 27 MHz, a bias power of between about 0-500 W at 2 MHz, and supplying an etching gas composed of $C_xH_yF_z$ (x,y,z are zeros or natural numbers), and an inert gas composed of at least one of Ar, He, $O_2$, and $N_2$ inside a chamber. Because UV radiation can be generated while the plasma etching process is performed, the use of capping layer 90 prevents absorbsion of the UV radiation to semiconductor substrate 10. Meaning, when capping layer 90 is an organic BARC layer, the UV radiation is absorbed in capping layer 90, thereby preventing generation of a dark current. Alternatively, when capping layer 90 is a metal layer, the UV radiation is reflected by capping layer 90, also preventing generation of a dark current.

Figure 6:
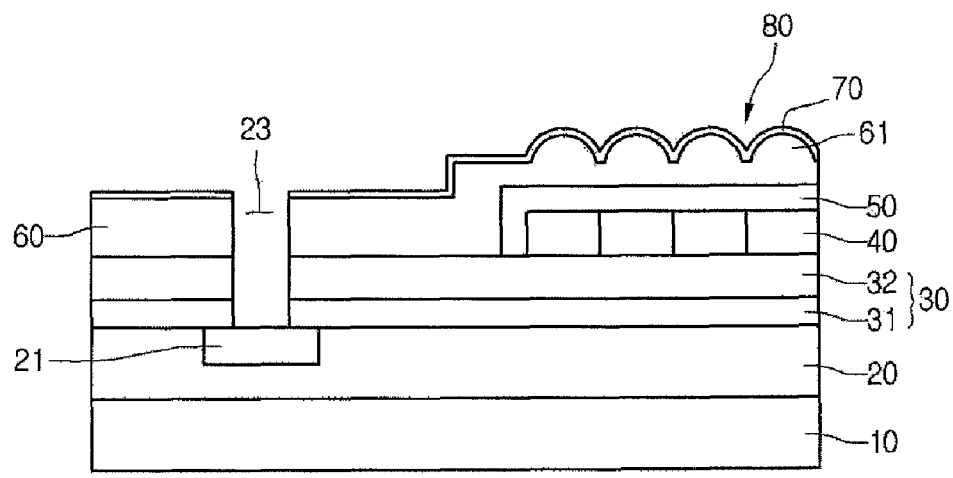

As illustrated in example FIG. 6, after the etching process to expose pad 21, pad mask 100 can be removed by performing an ashing process at a temperature range of between about 0-50° C. Specifically, pad mask 100 can be removed using $O_2$ gas at a temperature of 0° C. This can be performed by lowering the temperature of a lower electrode on which semiconductor substrate 10 is seated.

If capping layer 90 is composed of an organic layer such as BARC, capping layer 90 can be simultaneously removed while pad mask 100 is removed since they are formed of an organic material. Removing pad mask 100 and capping layer 90 can typically require a temperature of 200° C. or more at which a process for removing a photoresist layer has been performed. In accordance with embodiments, such a high temperature is not required, so that the surface of the microlens array 80 can be prevented from being damaged by exposure to high temperatures.

If capping layer 90 is composed of a metal layer, pad mask 100 can be removed first and removal of capping layer 90 can be subsequently performed. Capping layer 90 formed of a metal material can be removed using an etching gas including an element belonging to a halogen group such as F, Cl, etc.

In accordance with embodiments, a method for manufacturing an image sensor can form a microlens array formed of an inorganic material to prevent the microlenses from being damaged by subsequent package and bump processes. Such a method can form gapless microlenses to improve the sensitivity of the image sensor. Moreover, such a method can including formation of a capping layer on and/or over the surface of the microlens array to prevent generation of a dark current by plasma during subsequent processes, and thereby enhancing the overall quality of the image sensor.

Any reference in this specification to "one embodiment," an embodiment," example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing an image sensor comprising:
   forming an interlayer dielectric layer including a pad over a semiconductor substrate;
   forming a color filter array directly over the interlayer dielectric layer;
   forming a microlens array over the color filter array;
   forming a capping layer over the semiconductor substrate including the microlens array;
   forming a pad mask over the capping layer; and then exposing the pad,
   wherein forming the microlens array comprises:
   forming a first dielectric layer over the color filter array;
   forming a microlens array mask over the first dielectric layer; and then
   etching the first dielectric using the microlens mask to form a plurality of microlenses spaced apart from adjacent microlenses.

2. The method of claim 1, wherein exposing the pad comprises performing a plasma etching process using the pad mask as an etch mask.

3. The method of claim 1, further comprising, after exposing the pad, simultaneously removing the pad mask and the capping layer.

4. The method of claim 3, wherein the pad mask and the capping layer are removed using an $O_2$ gas at temperature of between about 0-50° C.

5. The method of claim 1, wherein the capping layer comprises an organic bottom anti-reflection coating layer.

6. The method of claim 1, wherein the capping layer comprises a metal layer.

7. The method of claim 6, further comprising:
   removing the pad mask after the exposing of the pad; and then
   removing the capping layer.

8. The method of claim 7, wherein the capping layer is removed using an etching gas comprising an element belonging to a Halogen group.

9. The method of claim 1, further comprising depositing a second dielectric over the microlenses and in the spaces between adjacent microlenses.

10. The method of claim 1, wherein each one of the first dielectric layer and the second dielectric layer comprises at least one of an oxide layer, a nitride layer, and an oxide nitride layer.

11. The method of claim 1, wherein the capping layer has a thickness of between about 100-3,000 Å.

12. The method of claim 1, further comprising forming a planarization layer after the forming of the color filter array but before forming the microlens array.

13. A method of manufacturing an image sensor comprising:
   forming an interlayer dielectric layer including a pad over a semiconductor substrate;
   forming a passivation layer over the interlayer dielectric layer;
   forming a color filter array over the passivation layer;
   forming a planarization layer over the color filter array;
   forming a microlens array over the planarization layer including a first dielectric layer over the planarization layer and a second dielectric layer formed over the first dielectric layer;
   forming an organic layer over the semiconductor substrate including the microlens array;
   forming a pad mask over the organic layer, the pad mask including a first pad hole exposing an upper surface portion of the organic layer which spatially corresponds to the pad;
   exposing an uppermost surface of the pad by etching the organic layer, the second dielectric layer, the first dielectric layer, and the passivation layer using the pad mask as an etch mask; and then
   simultaneously removing the organic layer and the pad mask,
   wherein forming the microlens array comprises:
   forming the first dielectric layer over the planarization layer and the passivation layer;
   forming a microlens array mask over the first dielectric layer including a plurality of microlens masks formed spaced apart;
   forming a seed microlens array by performing an etching process on the first dielectric layer using the microlens array masks as an etch mask; and then
   forming the second dielectric layer over the first dielectric layer including the seed microlens array and also in gaps between adjacent seed microlenses.

14. The method of claim 13, wherein forming the passivation layer comprises:
   depositing a tetraethyl-ortho-silicate layer at thickness of between 1,000-5,000 Å over the interlayer dielectric layer, and then
   depositing a nitride layer at a thickness of between 1,000-10,000 Å over the tetraethyl-ortho-silicate layer.

15. The method of claim 13, wherein the organic layer comprises a bottom anti-reflection coating layer having a thickness of between about 100-3,000 Å.

16. The method of claim 13, wherein the organic layer and the pad mask are removed using $O_2$ gas at a temperature of between about 0-50° C.

17. A method of manufacturing an image sensor comprising:
   forming an interlayer dielectric layer including a pad over a semiconductor substrate;
   forming a passivation layer over the interlayer dielectric layer;
   forming a color filter array over the passivation layer;
   forming a planarization layer over the color filter array;
   forming a microlens array over the planarization layer including a plurality of contacting microlenses having a zero gap therebetween, the microlens array further including a first dielectric layer over the planarization layer and a second dielectric layer formed over the first dielectric layer;
   forming a metal layer over the semiconductor substrate including the microlens array;
   forming a pad mask over the metal layer, the pad mask including a first pad hole exposing an upper surface portion of the metal layer which spatially corresponds to the pad;
   exposing an uppermost surface of the pad by etching the metal layer, the second dielectric layer, the first dielectric layer, and the passivation layer using the pad mask as an etch mask;
   removing the pad mask; and then
   removing the metal layer,
   wherein forming the microlens array comprises:
   forming the first dielectric layer over the planarization layer and the passivation layer;
   forming a microlens array mask over the first dielectric layer including a plurality of microlens masks formed spaced apart;
   forming a seed microlens array by performing an etching process on the first dielectric layer using the microlens array masks as an etch mask; and then
   forming the second dielectric layer over the first dielectric layer including the seed microlens array and also in gaps between adjacent seed microlenses.

18. The method of claim 17, wherein the metal layer is composed of a material having an electrical conductivity of about $10^{-6}$ ohm/m or more, and wherein the metal layer is removed using an etching gas including an element in the Halogen group.

* * * * *